(12) United States Patent
Weidman et al.

(10) Patent No.: US 8,536,068 B2
(45) Date of Patent: Sep. 17, 2013

(54) ATOMIC LAYER DEPOSITION OF PHOTORESIST MATERIALS AND HARD MASK PRECURSORS

(75) Inventors: Timothy W. Weidman, Sunnyvale, CA (US); Timothy Michaelson, Milpitas, CA (US); Paul Deaton, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 169 days.

(21) Appl. No.: 13/267,213

(22) Filed: Oct. 6, 2011

(65) Prior Publication Data

US 2012/0088369 A1    Apr. 12, 2012

Related U.S. Application Data

(60) Provisional application No. 61/390,396, filed on Oct. 6, 2010.

(51) Int. Cl.
 *H01L 21/31*    (2006.01)

(52) U.S. Cl.
 USPC .................................. 438/780; 257/E21.259

(58) Field of Classification Search
 USPC .................................. 438/780; 257/E21.259
 See application file for complete search history.

(56) References Cited

U.S. PATENT DOCUMENTS

| | | | |
|---|---|---|---|
| 5,885,751 A | 3/1999 | Weidman et al. | |
| 6,238,844 B1 | 5/2001 | Joubert et al. | |
| 6,262,181 B1 | 7/2001 | Bantu et al. | |
| 6,573,030 B1 | 6/2003 | Fairbairn et al. | |
| 6,821,718 B2 | 11/2004 | Angelopoulos et al. | |
| 6,835,671 B2 * | 12/2004 | Hector et al. | 430/5 |
| 6,989,227 B2 | 1/2006 | Weidman et al. | |
| 8,153,348 B2 * | 4/2012 | Nemani et al. | 430/313 |
| 2005/0074689 A1 | 4/2005 | Angelopoulos et al. | |
| 2009/0208880 A1 | 8/2009 | Nemani et al. | |
| 2009/0272965 A1 * | 11/2009 | Rachmady et al. | 257/24 |
| 2012/0088193 A1 * | 4/2012 | Weidman et al. | 430/296 |

FOREIGN PATENT DOCUMENTS

KR    2001-001992    3/2001

OTHER PUBLICATIONS

Burton, B. B. et al., "SiO2 Atomic Layer Deposition Using Tris(dimethylamino)silane and Hydrogen Peroxide Studied by in Situ Transmission FTIR Spectoscopy", *J. Phys. Chem. C XXXX* , 9 pgs.
"International Preliminary Report on Patentability for PCT/US2011/055102", mailed on Apr. 18, 2013 , 5 pgs.
PCT International Search Report & Written Opinion in PCT/US2011/055102, mailed Apr. 13, 2012, 7 pgs.
PCT International Preliminary Report on Patentability and Written Opinion in PCT/US2011/055074, mailed May 4, 2012, 8 pages.
PCT International Search Report and Written Opinion in PCT/US2011/055074, mailed May 4, 2012, 12 pgs.

\* cited by examiner

*Primary Examiner* — Trung Q Dang
(74) *Attorney, Agent, or Firm* — Servilla Whitney LLC

(57) ABSTRACT

Methods for forming photoresists sensitive to radiation on substrate are provided. Atomic layer deposition methods of forming films (e.g., silicon-containing films) photoresists are described. The process can be repeated multiple times to deposit a plurality of silicon photoresist layers. Process of depositing photoresist and forming patterns in photoresist are also disclosed which utilize carbon containing underlayers such as amorphous carbon layers.

34 Claims, 5 Drawing Sheets

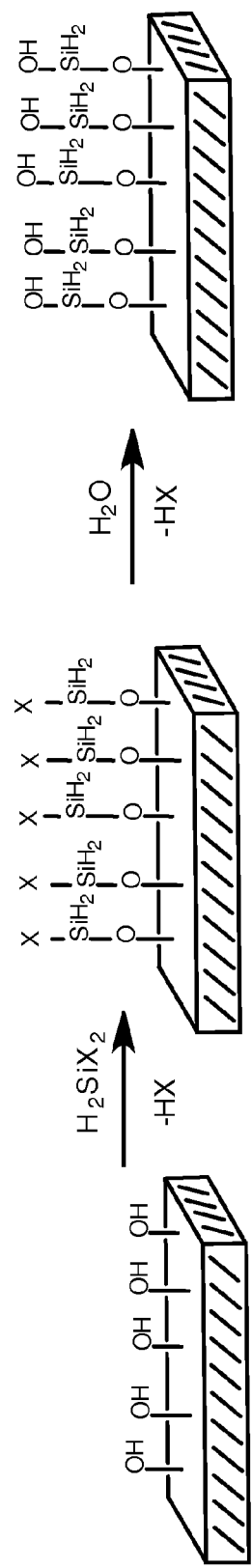
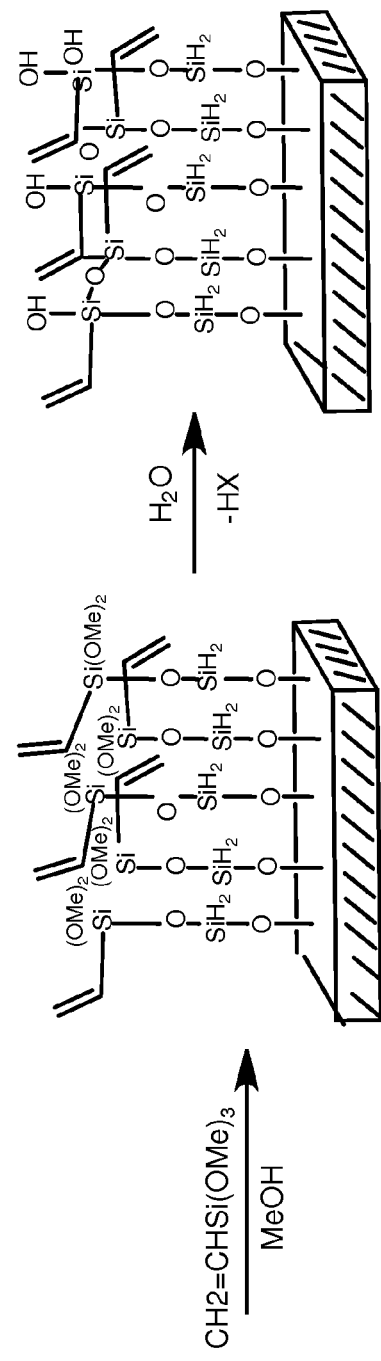
FIG. 4A
FIG. 4B

ATOMIC LAYER DEPOSITION OF PHOTORESIST MATERIALS AND HARD MASK PRECURSORS

BACKGROUND

Embodiments of the present invention generally relate to radiation sensitive photoresist materials and methods of manufacturing and patterning such photoresists.

In the manufacture of integrated circuits (IC) or chips, patterned exposure of light is used to define useful shapes or features on the surface of a substrate such a semiconductor wafer, typically in a photosensitive photoresist material. Feature sizes on chips are continually becoming smaller, requiring more sophisticated shorter wavelength lithography technologies. Next generation lithography (NGL) is expected to replace the current optical lithography method, for example, in the 20 nm technology node and beyond. Extreme ultraviolet (EUV) lithography (EUVL) EUVL shows promise as a next generation lithography technique, as well as far UV, x-ray lithography and electron beam (e-beam) lithography.

Extreme ultraviolet lithography ("EUVL") employs short wavelength radiation ("light") in the approximate range of 10 nanometers (nm) to 15 nm to pattern features having a size smaller than 100 nm. Because extreme ultraviolet ("EUV") radiation is absorbed in almost all materials, a mask used in the EUVL is a reflective mask. The reflective mask reflects the radiation in certain regions and absorbs the radiation in other regions of the mask. Light reflected from the mask reproduces an image of the mask on photoresist (or "resist") disposed on a wafer substrate such as silicon. When illuminated or exposed to radiation, the photoresist undergoes chemical reactions and is then developed to produce a replicated pattern of the mask on the wafer.

Desirable attributes of resist materials sensitive to EUV, far UV, E-beam and x-ray radiation include one or more of robust adhesion, thermal and mechanical stability, and removability using plasma etching or stripping, for example, oxygen plasma etching. Since EUV and other types of next generation lithography exposures such as far UV, and e-beam are conducted under vacuum, outgassing of volatile components, which may contaminate expensive reflective multilayer optical elements, should be minimized or eliminated. It may also be desirable for the resist to exhibit sufficient conductivity to minimize proximity effects associated with secondary electrons generated during exposure to radiation.

SUMMARY OF THE INVENTION

One embodiment of the present invention relates to methods for forming a radiation sensitive photoresist on a substrate comprising: exposing a substrate sequentially to alternating pulses of a first precursor containing substituents with cross-linkable moieties and a reactant selected from ozone, $H_2O$, $H_2O_2$, $NH_3$, reactive oxygen, reactive nitrogen, and reactive hydrogen and a second precursor containing reactive moieties cross-linkable with the substituents in the first precursor to form a deposited layer such that reactive, cross-linkable moieties present in the first precursor and second precursor in the deposited layer remain partially unreacted and soluble to developer solution; and selectively exposing portions of the deposited layer to radiation to create a pattern in which exposed portions of the deposited layer contain cross-linked moieties that form a film on the substrate that is less soluble in a developer solution than unexposed portions of the deposited layer. The radiation may be selected from EUV, far UV, X-ray and e-beam. In one embodiment, the method further comprises contacting the unexposed portions of the deposited layer with developer solution and removing the unexposed portions from the substrate. In a specific embodiment, the radiation exposure comprises exposure to an electron beam. In other embodiments, the radiation exposure is carried out in a vacuum.

In specific embodiments, the precursor is a metal or metal oxide precursor. In other specific embodiments, the radiation can be EUV, far ultraviolet (far UV, 200 nm and under), X-ray and electron beam, which can be used in patterning photoresist. According to one or more embodiments, photoresist materials may also be formed that are sensitive to other forms of irradiation such as, X-ray, ion beam, and other radiation sources.

In one embodiment, the deposited layer is formed by atomic layer deposition including: (a) exposing the substrate to a pulse of a first precursor, for example, a metal oxide precursor, containing substituents with cross-linkable moieties deposited on the substrate; (b) exposing the substrate to a first reactant pulse selected from ozone, $H_2O$, $H_2O_2$, $NH_3$, reactive oxygen, reactive nitrogen, and reactive hydrogen to surface react with the first precursor; (c) exposing the substrate to a second precursor, for example, a metal oxide precursor, containing reactive moieties cross-linkable with the substituents in the first precursor; and (d) exposing the substrate to a second reactant pulse selected from ozone, $H_2O$, $H_2O_2$, $NH_3$, reactive oxygen, reactive nitrogen, and reactive hydrogen to surface react with the second precursor. In one embodiment, (a) through (d) comprise a single atomic layer deposition cycle and the cycle is repeated at least once. In one embodiment, the first precursor and the second precursor are the same. In one embodiment, the first precursor and the second precursor are different. In a more specific embodiment, the first precursor is TSA and the second precursor is acetylene. In one embodiment, the reactant pulse is selected from one of reactive oxygen, hydrogen and nitrogen species, wherein the reactive species is generated in a remote plasma. In one embodiment, the unexposed deposited layer portions are only partially hydrolyzed or remain incompletely condensed. In one embodiment, the sequential alternating pulses are followed by a purge process. In specific embodiments, precursors are selected from volatile silicon containing precursors.

In one or more embodiments, prior to formation of the deposited layer, the substrate surface is coated by an amorphous carbon layer or polymer film insoluble in the developer solution. In one embodiment, the polymer is a carbon-containing photoresist. In one embodiment, the cross-linkable moieties present in the first metal oxide precursor include Si—H bonds, and in the second precursor, include silanol, vinyl, allyl, or halomethyl groups.

A second aspect of the invention pertains to a method for forming a patterned photoresist on a substrate comprising exposing a substrate sequentially to alternating pulses of a Si—H containing precursor and a silicon-containing precursor containing cross-linkable moieties by atomic layer deposition to form a deposited layer on the substrate; and selectively exposing portions of the layer to radiation such as extreme ultraviolet light to form a pattern in which exposed portions of the deposited layer is more cross-linked than unexposed portions of the deposited layer on the substrate. The radiation may be selected from EUV, far UV, X-ray and e-beam. In one embodiment of the second aspect, the exposed portions of the deposited layer form a cross linked silicon-containing film on the substrate. In one embodiment of the second aspect, the silicon-containing precursor comprises a silicon oxide precursor. In one embodiment of the second aspect, the method further comprises exposing the substrate to a first reactant pulse selected from ozone, $H_2O$, $H_2O_2$, $NH_3$, reactive oxygen, reactive nitrogen, and reactive hydrogen to surface react with the first metal oxide precursor after exposing the substrate to the Si—H containing precursor and to the silicon-containing precursor containing cross-linkable moieties. In one embodiment of the second aspect, selectively exposing portions of the layer provides unexposed portions of the deposited layer in a form more soluble in a developer solution than the exposed portions. One embodiment of the second aspect includes removing the soluble layer portions. According to an embodiment of the second aspect, the unexposed soluble layer portions are only partially hydrolyzed or are hydrolyzed but incompletely condensed. In one or more embodiments of the second aspect, the sequential alternating pulses are followed by a purge process. In one embodiment of the second aspect, the cross-linkable moieties include hydroxyl, vinyl, allyl, or halomethyl groups. In an embodiment of the second aspect, the Si—H containing precursor is selected from the group trisilylamine, 1,3,5-trisilacyclohexane, 1,3,5-trisilapentane, bis(diethylamino)silane, bis(tertiarybutylamino)silane, dichlorosilane, dibromosilane, diiodosilane, and disilane.

In an embodiment of the second aspect, the deposition of the Si—H containing layer employs a remote plasma activation performed immediately prior, during, or after the introduction of the Si—H containing precursor. In an embodiment of the second aspect, the second silicon-containing precursor providing a cross-linkable moiety is a silicon oxide based precursor containing one or more of a vinyl substituent, an allyl substituent, a halomethyl substituent, alkoxides, carboxylates, and halides which hydrolyze on exposure to water to form silanol substituents, at least some of which remain non-condensed in the resulting film prior to extreme UV exposure. In an embodiment of the second aspect, prior to forming the deposited layer, an underlayer is deposited on the substrate. In embodiments, including an underlayer, the underlayer is a carbon-containing layer formed by chemical vapor deposition. For example, the underlayer can comprise amorphous carbon. After the unexposed portions of the film are removed by a develop step, the exposed portions of the deposited layer provide a mask for the underlayer. One or more embodiments include performing an oxygen reactive ion etch process to pattern transfer through the mask and the underlayer to form the pattern.

A third aspect pertains to a method of forming a patterned photoresist on a substrate comprising: forming a carbon-containing film on the substrate; forming surface layer in the carbon-containing film that is sensitive to radiation; exposing a portion of the carbon-containing film to radiation to provide an exposed surface portion; and selectively depositing by atomic layer deposition a metal oxide film only on the exposed regions of the carbon-containing film. The radiation may be selected from EUV, far UV, X-ray and e-beam. In an embodiment of the third aspect, the method includes performing an etch process to etch pattern transfer through the organic underlayer to form the pattern. In an embodiment of the third aspect, the etch process comprises an oxygen reactive ion etch process.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIGS. 4A-4C show an embodiment of a sequential process for depositing silicon oxide photoresist layer and forming a pattern on a substrate on the substrate.

DETAILED DESCRIPTION

Figure 1A:
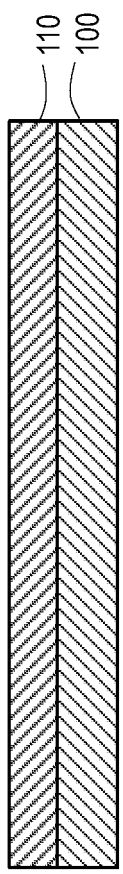
FIGS. 1A-1C show an embodiment of sequential process for depositing photoresist layer and forming a pattern on a substrate.

Embodiments of the invention generally provide radiation sensitive photoresist materials and methods of manufacturing and patterning such photoresists. One embodiment pertains to methods of manufacturing ultrathin, high performance EUV sensitive photoresist layers, for example by deposition via ALD. However, the invention is not limited to EUV, and other radiation can be used according to one or more embodiments. In other specific embodiments, the radiation can be far ultraviolet, X-ray and electron beam that can be used in patterning photoresist. According to other embodiments, photoresist materials may also be formed that are sensitive to other forms of irradiation such as, X-ray, electron beam, and other radiation sources. Collectively, such radiation including EUV, far UV, electron beam (or e-beam or EB), and X-ray will be considered suitable forms of radiation methods.

As used herein, "far UV" refers to radiation at a wavelength below 200 nm. "Extreme UV" (or "EUV") refers to radiation in the approximate range of 5 nanometers (nm) to 120 nm, and in specific embodiments, in the range of 10 nm to 15 nm. "Electron beam" lithography, "E-beam" lithography or "EBL" refers to lithography using an electron beam generated from a source, for example $LaB_6$, that is made to pass through an assembly of lenses and manipulated by deflectors, etc. to expose resist film. "X-ray" lithography refers to techniques for exposing photoresist using x-ray radiation. As used herein, the terminology "metal" and "metal oxide" refers to metal elements in the periodic table, metalloids such as silicon and germanium, and oxides of metals and metalloids. Specific materials according to one or more embodiments include but are not limited to silicon, germanium, tin, hafnium, zirconium, titanium, group V and VI metals and oxides thereof.

According to one or more embodiments, radiation such as EUV can be used in the direct patterning of features as small as 10 nm utilizing a resist layer that has a thickness that is also as small as 10 nm, but generally in the range of 10 nm to 30 nm. Photoresist layers having a thickness on the order of 200 Angstroms (20 nm) are of interest because this value approximates the penetration depth of radiation such as EUV light in many materials. Presently available organic resists are required to be about twice this value (400 Angstroms and higher) to provide reasonable etch resistance, however, at the expense of degradation of resolution when employed for EUV applications.

The coating of uniform films of any material, particularly inorganic resist films over an organic underlayer with 1 Angstrom uniformity without defects is difficult to achieve by conventional spin-coating, which are often referred to as "wet" techniques, or any other commonly established method for coating EUV photoresists. According to embodiments of the invention, "dry" deposition techniques such as Atomic Layer Deposition (ALD) provide the unique ability to assemble a film with not only atomic layer control of thickness but also the placement of reactive functionality that can survive the (mild) deposition conditions and create developer solubility (e.g., reactivity with aqueous developers) together with high sensitivity to EUV (and other radiation such as far UV, DUV and electron beam) involving cross-linking with the loss of solubility, thus allowing patterns to be developed.

In one or more embodiments, a film composed largely of silicon and in some embodiments, oxygen, and useful as a silicon (or silicon dioxide) precursor is deposited on a substrate using atomic layer deposition and is used as a radiation such as EUV sensitive photoresist. Silicon dioxide exhibits greater than 100:1 selectivity to organics under many oxygen based plasma etch processes, such that thin patterned layers may be used to transfer images through the underlying organic layers. Patterned photoresist films rich in atomic silicon in any form tend to be rapidly converted into $SiO_2$ when exposed to such oxygen plasmas, thereby forming etch resistant $SiO_2$ based masks.

There are numerous potentially useful combinations of reactive substituents which can be utilized to impart sensitivity to radiation such as e-beam, x-ray, EUV and far UV light, an example including the presence of Si—H bonds. While materials with such functionality can be prepared in forms suitable for spin-coating, formulations for doing so can prove either too unstable (for example, to traces of air, moisture, handling at room temperature, etc.) or require too high an EUV dose to be practical. Because embodiments of the ALD EUV resist process are performed in a vacuum chamber environment, and EUV exposure will also be performed in vacuum, reliable coating, handling and exposure of films can be achieved even with materials exhibiting a high content of Si—H. Embodiments of the invention permit the use of such less stable materials, as well as the controlled deposition of materials with other substituents sensitive to e-beam, x-ray, far UV, and EUV radiation, and a method for the deposition of defect-free films of useful compositions also achievable by other means.

In one embodiment, photoresists are manufactured using an atomic layer deposition (ALD) process to form a layer that can be patterned by exposure to radiation, for example, e-beam, x-ray, far UV or EUV light. In exemplary embodiment of an ALD process, a first chemical precursor ("A") is pulsed, for example, delivering a metal species containing substituents to the substrate surface in a first half reaction. A first chemical precursor "A" is selected so its metal reacts with suitable underlying species (for example OH or NH functionality on the surface) to form new self-saturating surface. Excess unused reactants and the reaction by-products are removed, typically by an evacuation-pump down and/or by a flowing inert purge gas. Then a non-metal reactant "B", for example vapors of water or hydrogen peroxide/water, or water along with a volatile acid (such as HCl) or base (such as $NH_3$) or a gas or plasma containing an active hydrogen, oxygen or nitrogen species, is delivered to the surface, wherein the previously reacted terminating substituents or ligands of the first half reaction are reacted with new ligands from the "B" reactant, creating an exchange by-product. The "B" reactant also forms self saturating bonds with the underlying reactive species to provide another self-limiting and saturating second half reaction. A second purge period is typically utilized to remove unused reactants and the reaction by-products. Thereafter, a second metal-containing precursor "A" with reactive moieties cross-linkable with substituents present in the first "A" precursor is pulsed to the substrate surface, which reacts with ligands from the non-metal reactant. Typically, a third purge is then utilized to remove unused reactants and the reaction by-products. The deposition cycle of pulses of the "A" precursor, "B" non-metal reactant, and "A" precursor (typically including purges between each pulse) results in the substituents present in the "A" precursor and the reactive, cross-linkable moieties present in the "A" precursor and second precursor remain partially unreacted in the deposited layer which is soluble in developer solution. The alternating exposure of the surface to reactants "A" and "B" is continued until the desired thickness of the EUV sensitive film is reached, which for most anticipated applications would be approximately in the range of 5 nm to 40 nm, and more specifically in the range of 10 and 30 nm (100 Angstroms to 300 Angstroms). It will be understood that the "A", "B", and purge gases can flow simultaneously, and the substrate and/or gas flow nozzle can oscillate such that the substrate is sequentially exposed to the A, purge, and B gases as desired.

The deposited layer containing partially unreacted, cross-linkable moieties is then selectively exposed to radiation such as e-beam, x-ray, or far or extreme ultraviolet light to create a pattern so that exposed portions of the deposited layer contain cross-linked moieties from the first and second precursors to form a metal containing film on the substrate that is less soluble in developer solution than unexposed portions of the deposited layer.

The precursors and/or reactants may be in a state of gas, plasma, vapor or other state of matter useful for a vapor deposition process. During the purge, typically an inert gas is introduced into the processing chamber to purge the reaction zone or otherwise remove any residual reactive compound or by-products from the reaction zone. Alternatively, the purge gas may flow continuously throughout the deposition process so that only the purge gas flows during a time delay between pulses of precursor and reactants.

Thus, in one or more embodiments, alternating pulses of "A" precursor and "B" reactant can be used to manufacture a photoresist, for example, in a pulsed delivery of multiple cycles of pulsed precursors and reactants, for example, A pulse, B reactant pulse, A precursor pulse, B reactant pulse, A precursor pulse, B reactant pulse, A reactant pulse, B reactant pulse. In one or more embodiments, at least two different types of metal-containing (e.g., silicon) precursors can be utilized. Thus, a "C" metal-containing precursor may be utilized, wherein the "C" metal-containing precursor is different from the "A" metal-containing precursor thereby providing ALD cycle A, B, C, B, A, B, C, B, A, B, C, B . . . (a specific example of which shown in FIGS. 4A-4C, described below) (with purges in between each pulse). Likewise a different type of second reactant (a "D" reactant) may be utilized in a reaction sequence, in which "B" and "D" reactants are different to provide a reaction sequence in which the following pulsed ALD cycle is utilized A, B, C, D, A, B, C, D . . . (with purges between each pulse). As noted above, instead of pulsing the reactants, the gases can flow simultaneously from a gas delivery head or nozzle and the substrate and/or gas delivery head can be moved such that the substrate is sequentially exposed to the gases.

Of course, the aforementioned ALD cycles are merely exemplary of a wide variety of ALD process cycles in which a deposited layer is formed by alternating layers of precursors and reactants in which reactive, cross-linkable moieties present in the precursors remain partially unreacted in the deposited layer which is soluble in developer solution. The deposited layer containing partially unreacted, cross-linkable moieties may then be selectively exposed to far or extreme ultraviolet light to create a pattern so that exposed portions of the deposited layer contain cross-linked moieties from the first and second precursors to form a metal oxide film on the substrate that is less soluble to developer solution than unexposed portions of the deposited layer.

A deposition gas or a process gas as used herein refers to a single gas, multiple gases, a gas containing a plasma, combinations of gas(es) and/or plasma(s). A deposition gas may contain at least one reactive compound for a vapor deposition process. The reactive compounds may be in a state of gas, plasma, vapor, during the vapor deposition process. Also, a process may contain a purge gas or a carrier gas and not contain a reactive compound.

A "substrate surface," as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, silicon nitride, doped silicon, germanium, gallium arsenide, glass, sapphire, and any other materials such as metals, metal nitrides, metal alloys, and other conductive materials, depending on the application. Barrier layers, metals or metal nitrides on a substrate surface include titanium, titanium nitride, tungsten nitride, tantalum and tantalum nitride, aluminum, copper, or any other conductor or conductive or non-conductive barrier layer useful for device fabrication. Substrates may have various dimensions, such as 200 mm or 300 mm diameter wafers, as well as, rectangular or square panes. Substrates on which embodiments of the invention may be useful include, but are not limited to semiconductor wafers, such as crystalline silicon (e.g., Si<100> or Si<111>), silicon oxide, strained silicon, silicon germanium, doped or undoped polysilicon, doped or undoped silicon wafers, III-V materials such as GaAs, GaN, InP, etc. and patterned or non-patterned wafers. Substrates may be exposed to a pretreatment process to polish, etch, reduce, oxidize, hydroxylate, anneal and/or bake the substrate surface.

Embodiments of the invention provide a method for depositing or forming radiation such as e-beam, x-ray, far UV and/or EUV sensitive photoresist on a substrate during a vapor deposition process, such as atomic layer deposition or plasma-enhanced ALD (PE-ALD). A processing chamber is configured to expose the substrate to a sequence of gases and/or plasmas during the vapor deposition process. The processing chamber would include separate supplies of the A, B, and C reactants, along with a supply of carrier, purge and inert gases such as argon and nitrogen in fluid communication with gas inlets for each of the reactants and gases. Each inlet may be controlled by an appropriate flow controller such as a mass flow controller or volume flow controller in communication with a central processing unit (CPU) that allows flow of each of the reactants to the substrate to perform a ALD process as described herein. Central processing unit may be one of any forms of a computer processor that can be used in an industrial setting for controlling various chambers and sub-processors. The CPU can be coupled to a memory and may be one or more of readily available memory such as random access memory (RAM), read only memory (ROM), flash memory, compact disc, floppy disk, hard disk, or any other form of local or remote digital storage. Support circuits can be coupled to the CPU to support the CPU in a conventional manner. These circuits include cache, power supplies, clock circuits, input/output circuitry, subsystems, and the like.

The reactants are typically in vapor or gas form. The reactants may be delivered with a carrier gas. A carrier gas, a purge gas, a deposition gas, or other process gas may contain nitrogen, hydrogen, argon, neon, helium, or combinations thereof. Plasmas may be useful for depositing, forming, annealing, treating, or other processing of photoresist materials described herein. The various plasmas described herein, such as the nitrogen plasma or the inert gas plasma, may be ignited from and/or contain a plasma reactant gas. The plasma reactant gas may contain nitrogen, oxygen, hydrogen, ammonia, $N_2O$, $H_2O$, $H_2O_2$, ozone ($O_3$), argon, neon, helium, or combinations thereof. In some examples, the plasma may involve mixtures nitrogen and hydrogen or contain ammonia ($NH_3$) a compound of nitrogen and hydrogen.

In one or more embodiments, the various gases for the process may be pulsed into an inlet, through a gas channel, from various holes or outlets, and into a central channel. In one or more embodiments, the deposition gases may be sequentially pulsed to and through a showerhead. Alternatively, as described above, the gases can flow simultaneously through gas supply nozzle or head and the substrate and/or the gas supply head can be moved so that the substrate is sequentially exposed to the gases.

In another embodiment, a photoresist material may be formed during PE-ALD process that provides sequential pulses of a precursors and plasma. In these embodiments, during the plasma step the reagents are generally ionized during the process, though this might occur only upstream of the deposition chamber such that ions or other energetic or light emitting species are not in direct contact with the depositing film—this configuration being often termed a remote plasma. Thus in this type of PE-ALD process—which will generally be most applicable to the formation of films which retain far and EUV reactivity, the plasma is generated external from the processing chamber, such as by a remote plasma generator system. During PE-ALD processes, a plasma may be generated from a microwave (MW) frequency generator or a radio frequency (RF) generator.

Another aspect of the invention pertains to an apparatus for deposition of a film on a substrate to perform a process according to any of the embodiments described above. In one embodiment, the apparatus comprises a deposition chamber for atomic layer deposition of a film on a substrate. The chamber comprises a process area for supporting a substrate. The apparatus includes a first precursor inlet in fluid communication with a supply of a first precursor containing substituents with cross-linkable moieties. The apparatus includes a reactant gas inlet in fluid communication with a supply of a reactant gas selected from ozone, $H_2O$, $H_2O_2$, $NH_3$, reactive oxygen, reactive nitrogen, and reactive hydrogen. A supply of a second precursor containing reactive, moieties cross-linkable with the substituents in the first precursor may be in fluid communication with the first precursor gas inlet or a separate second precursor gas inlet. The apparatus further includes a purge gas inlet in fluid communication with a purge gas. The apparatus can further include a vacuum port for removing gas from the deposition chamber. The apparatus can further include an auxiliary gas inlet for supplying one or more auxiliary gases such as inert gases to the deposition chamber. The deposition can further include a means for heating the substrate by radiant and/or resistive heat. The apparatus include a radiation source or can be connected to a second apparatus for exposing the deposited layer radiation selected from EUV, far UV, X-ray and e-beam radiation such that upon exposure to the radiation, reactive, cross-linkable moieties present in the first precursor and second precursor in the deposited layer remain partially unreacted and soluble to developer solution.

In some embodiments, a plasma system and processing chambers or systems which may be used during methods described here for depositing or forming photoresist materials can be performed on either PRODUCER®, CENTURA®, or ENDURA® systems, all available from Applied Materials, Inc., located in Santa Clara, Calif. A detailed description of an ALD processing chamber may be found in commonly assigned U.S. Pat. Nos. 6,878,206, 6,916,398, and 7,780,785. In another embodiment, a chamber configured to operate in both an ALD mode as well as a conventional CVD mode may be used to deposit photoresist materials is described in commonly assigned U.S. Pat. No. 7,204,886.

The ALD process provides that the processing chamber or the deposition chamber may be pressurized at a pressure within a range from about 0.01 Torr to about 100 Torr, for example from about 0.1 Torr to about 10 Torr, and more specifically, from about 0.5 Torr to about 5 Torr. Also, according to one or more embodiments, the chamber or the substrate may be heated to a temperature of less than about 500° C., for example, about 400° C. or less, such as within a range from about 50° C. to about 400° C., and in other embodiments less than about 300° C., less than about 200° C., or less than about 100°

Exemplary embodiments of an atomic layer deposition process cycles will now be described.

As described above, an ALD process cycle may include alternating pulses of "A" precursor (for example, metal oxide precursor) and "B" reactant with a purge between each pulse of precursor and reactant. Alternatively, an ALD process cycle may include alternating pulses of "A" precursor (for example, metal oxide precursor), "B" reactant, "C" precursor (for example, metal oxide precursor), and "B" reactant, where the "A" and "C" precursors are the same or different, with a purge between each pulse of precursor and reactant. An ALD process cycle may include alternating pulses of "A" precursor, "B" reactant, "C" precursor, and "D" reactant, where the "A" and "C" metal oxide precursors are the same or different and the "B" and "D" reactants are the same or different, with a purge between each pulse of precursor or reactant.

"A" Precursors

Non-limiting examples of "A" precursors include volatile metal-containing compounds, for example, compounds of silicon or other main group or transition metals bonded to at least one substituent which will be readily displaced upon reaction with surface bond species such as a hydroxyl group such that the substituent originally on the precursor is lost as a volatile compound and the metal atom together with its remaining substituents become bonded to the surface. Some specific examples of silicon based precursors using for introducing Si—H functionality useful for subsequent radiation such as EUV crosslinking reactions include bis(diethylamino)silane, bis(tertiarybutylamino)silane, diethoxysilane, dichlorosilane, dibromosilane, or diiodosilane. In other embodiments, the "A" precursor may be acetylene.

A simple, exemplary case of such a reaction involves the displacement of at least one readily hydrolyzable substituent from a volatile silicon containing precursor resulting in its attachment to the surface and the evolution of a volatile compound HX1. For example, substituent X1 might be a simple halide atom (Cl, Br, or I) in which case the evolved species would be HCl, HBr, or HI gas.

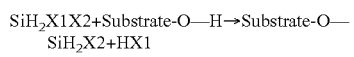

$$SiH_2X1X2 + Substrate\text{-}O\text{—}H \rightarrow Substrate\text{-}O\text{—}SiH_2X2 + HX1$$

"B" Reactants

Non-limiting examples of "B" reactants include ozone, $H_2O$, $H_2O_2$, $NH_3$, and reactive oxygen, nitrogen, or hydrogen containing species generated in a plasma, and in specific embodiments, a remote plasma. In an exemplary case, if B is simply water vapor, reaction with the remaining substituent X2 still attached to the silicon atom (already bonded to the surface as a result of its exposure to reactant "A" in the previous step can result in the formation of an Si—OH moiety with loss of a volatile byproduct HX2.

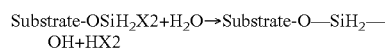

$$Substrate\text{-}OSiH_2X2 + H_2O \rightarrow Substrate\text{-}O\text{—}SiH_2\text{—}OH + HX2$$

"C" Precursors

Non-limiting examples of "C" precursors containing reactive moieties cross-linkable with Si—H substituents in the first precursor "A" include silanol, vinyl, or allyl substituents. In embodiments where "A" and "C" reactants are utilized, the "A" and "C" reactants can be the same or different. Thus, in one embodiment, the "A" precursor may be trisilylamine and the "C" precursor may be acetylene. In an exemplary embodiment illustrated in FIGS. 4A-4C, reactant C is vinyltrimethoxysilane ($(CH_2=CHSi(OMe)_3)$) where hydrolysis of at least one methoxy ($OCH_3$) substituent by the surface silanol results in the attachment of the vinyl substituted silicon in precursor "C" with the loss of volatile methanol ($CH_3OH$). This can be described as follows:

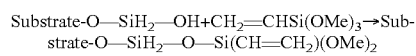

$$Substrate\text{-}O\text{—}SiH_2\text{—}OH + CH_2=CHSi(OMe)_3 \rightarrow Substrate\text{-}O\text{—}SiH_2\text{—}O\text{—}Si(CH=CH_2)(OMe)_2$$

"D" Reactants

Non-limiting examples of "D" reactants include ozone, $H_2O$, $H_2O_2$, $NH_3$, and reactive oxygen, nitrogen, or hydrogen containing species generated in a plasma, and in specific embodiments, a remote plasma. In embodiments where "B" and "D" reactants are utilized, the "B" and "D" reactants can be the same or different. Again, for an exemplary embodiment illustrated in the FIGS. 4A-4C, reactant D may be water vapor and result in the regeneration of surface Si—OH functionality, allowing full ALD sequence to begin again with another exposure of the surface to reactant A, B, C, and D. This sequence would be continued until the desired thickness of the EUV sensitive film and oxide precursor is produced on the substrate. In such a way, the illustrated four step ALD sequence can be used to create films in which reactive pendant groups—for example Si—H and Si—O—H and/or Si—CH=$CH_2$ will automatically be homogeneously and reproducibly oriented in close proximity.

Figure 4C:
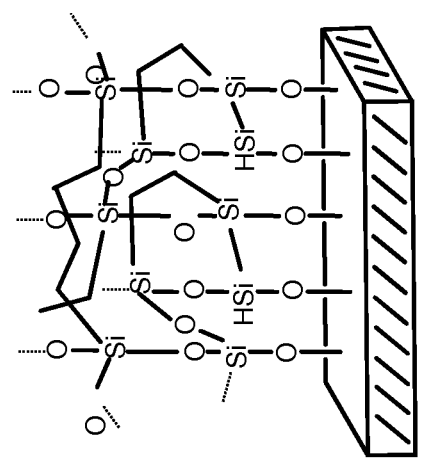
Figure 4C:
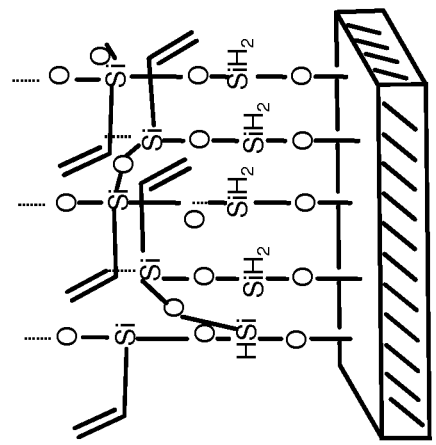

The as deposited, film formed by ALD in the process sequence shown in FIGS. 4A-4C can be exposed to patterned radiation such as EUV light (e.g., through a mask (not shown) to promote cross-linking to form a dense, glasslike material in the regions exposed to EUV light with greatly decreased solubility in aqueous developers or non-aqueous developers such as organic solvents it is also within the scope of the invention to use dry development methods such as plasma etch.

It will be understood that the resulting patterns can be developed to provide either negative tone or positive tone patterns, using either a liquid developer or a plasma based "dry" approach. In either case, the developed pattern may optionally be further annealed, with or without the presence of oxygen, to further cross-link the remaining material or convert it to a hard oxide, suitable for further processing. Such photolithography techniques are advantageous in that the deposition, development, patterning, and etching steps may all be performed in the gas phase, i.e., using dry processing techniques, such as dry plasma, reducing the potential for pattern collapse and thereby providing improved resolution.

The substrate with a EUV patterned ALD resist layer can be placed in a dilute water based etchant, including any suitable photoresist developer such as dilute tetramethyl ammonium hydroxide (TMAH) developer, aqueous triethanolamine, dilute fluoride, and mixtures thereof to remove the unexposed regions. It will be understood that the sequence shown in FIGS. 4A-4C results in the formation of a layer on the order of approximately 10 Angstroms, and the cycle can be repeated 20-30 times to achieve a resist stack on the order of 200 to 300 Angstroms in thickness.

Further examples of general and specific process sequences according to various embodiments will now be described.

Preparation of Substrate

A substrate can be any type of substrate described above. An optional process step involves preparation of a substrate 100 by treating the substrate with a plasma or other suitable surface treatment to provide active sites on the surface of the substrate. Examples of suitable active sites include, but are not limited to O—H, N—H, or S—H terminated surfaces.

In one or more embodiments, a specific underlayer may first be applied to the substrate. In specific embodiments, the underlayer can be a carbon based polymeric layer or an amorphous carbon based layer of the type described in U.S. Pat. Nos. 6,573,030; 6,841,341; 7,223,526; and 7,335,462. Such a layer can be deposited by a variety of techniques, for example, by the plasma induced polymerization of unsaturated monomeric precursors such as ethylene, propylene, acetylene, or any other volatile hydrocarbon based precursor useful in processes already implemented for the deposition of Applied Materials Advanced Patterning Film (APF®) layers, which can be produced in an APF® chamber on the Producer® system, available from Applied Materials, Inc. To facilitate its use as underlayer and initiation surface for the growth of the EUV sensitive film described herein, the initially hydrophobic surface of the heavily cross-linked amorphous carbon/hydrocarbon film may be modified by brief exposure to an oxidizing plasma formed in a gas mixture containing oxygen, ozone, water vapor, $N_2O$, $NH_3$, or any combination thereof. Alternatively, the surface can be modified and terminated at the time of its deposition by introducing at the very end of the deposition process a reactive monomer containing a substituent such as a terminal —OH group useful for initiating the deposition of the ALD layer described herein. Alternatively, the chemical vapor deposition process used to deposit the APF layer may be terminated by the addition of a simple silane precursor (such as silane itself ($SiH_4$), disilane ($H_3SiSiH_3$), trisilylamine ($N(SiH_3)_3$), or any other volatile Si—H rich precursor. In an embodiment, the precursor is trisilylamine. In such sequences, the formation of surface Si—OH moieties useful for initiating the growth of the ALD EUV resist layer may be subsequently generated at the beginning of the ALD sequence by brief exposure of the Si—H terminated amorphous carbon based layer to ozone or an oxygen containing plasma. However, to prevent interference with the subsequent processes involving the transfer patterns generated in the ALD EUV resist film through the organic underlayer, any such layer with Si—H functionality incorporated on the surface should be thinner than 50 Angstroms, specifically thinner than 10 Angstroms.

Delivery of Metal-Containing "A" Precursor to Substrate Surface

The substrate having active sites can be exposed to a metal-containing "A" precursor gas or vapor formed by passing a carrier gas (for example, nitrogen or argon) through an ampoule of the precursor, which may be in liquid form. The ampoule may be heated. The "A" precursor gas can be delivered at any suitable flow rate within a range from about 10 sccm to about 2,000 sccm, for example, from about 50 sccm to about 1,000 sccm, and in specific embodiments, from about 100 sccm to about 500 sccm, for example, about 200 sccm. The substrate may be exposed to the metal-containing "A" precursor gas for a time period within a range from about 0.1 seconds to about 10 seconds, for example, from about 1 second to about 5 seconds, and in a specific example, for approximately 2 seconds. The flow of the "A" precursor gas is stopped once the metal-containing precursor has adsorbed onto all reactive surface moieties on the substrate surface. In an ideally behaved ALD process, the surface is readily saturated with the reactive precursor "A" such that additional exposure would not result in additional deposition (i.e. the process is self-limiting due to the consumption of all reactive surface moieties).

First Purge

The substrate and chamber may be exposed to a purge step after stopping the flow of the "A" precursor gas. A purge gas may be administered into the processing chamber with a flow rate within a range from about 10 sccm to about 2,000 sccm, for example, from about 50 sccm to about 1,000 sccm, and in a specific example, from about 100 sccm to about 500 sccm, for example, about 200 sccm. The purge step removes any excess precursor, byproducts and other contaminants within the processing chamber. The purge step may be conducted for a time period within a range from about 0.1 seconds to about 8 seconds, for example, from about 1 second to about 5 seconds, and in a specific example, from about 4 seconds. The carrier gas, the purge gas, the deposition gas, or other process gas may contain nitrogen, hydrogen, argon, neon, helium, or combinations thereof. In one example, the carrier gas comprises nitrogen.

Delivery of "B" Reactant to Substrate Surface

After the first purge, the substrate active sites can be exposed a "B" reactant gas or vapor formed by passing a carrier gas (for example, nitrogen or argon) through an ampoule the "B" reactant. The ampoule may be heated. The "B' reactant gas can be delivered at any suitable flow rate within a range from about 10 sccm to about 2,000 sccm, for example, from about 50 sccm to about 1,000 sccm, and in specific embodiments, at about 200 sccm. The substrate may be exposed to the "B" reactant gas for a time period within a range from about 0.1 seconds to about 8 seconds, for example, from about 1 second to about 5 seconds, and in a specific example, for about 2 seconds. The flow of the "B" reactant gas may be stopped once "B" has adsorbed onto and reacted with readily hydrolyzable substituents attached to the silicon precursor deposited in the preceding step.

Second Purge

The substrate and chamber may be exposed to a purge step after stopping the flow of the "B" reactant gas. A purge gas may be administered into the processing chamber with a flow rate within a range from about 10 sccm to about 2,000 sccm, for example, from about 50 sccm to about 1,000 sccm, and in a specific example, from about 100 sccm to about 500 sccm, for example, about 200 sccm. The purge step removes any excess precursor, byproducts and other contaminants within the processing chamber. The purge step may be conducted for a time period within a range from about 0.1 seconds to about 8 seconds, for example, from about 1 second to about 5 seconds, and in a specific example, from about 4 seconds. The carrier gas, the purge gas, the deposition gas, or other process gas may contain nitrogen, hydrogen, argon, neon, helium, or combinations thereof. In one example, the carrier gas comprises nitrogen. The "B" reactant gas may also be in the form of a plasma generated remotely from the process chamber.

Delivery of Metal-Containing Precursor to Substrate Surface

After the second purge, a second metal-containing precursor gas or vapor is delivered to the substrate surface. The metal-containing precursor can be an "A" precursor as described above, or the metal-containing precursor can be a "C" precursor as described above. As noted above, the "C" precursor can be the same or different from the "A" precursor. The second metal-containing precursor containing reactive moieties cross-linkable with substituents present in the first "A" precursor is pulsed to the substrate surface, and react with surface functionality left following reaction with precursor "B". The second metal-containing precursor can be delivered as a precursor gas or vapor formed by passing a carrier gas (for example, nitrogen or argon) through an ampoule of the precursor, which may be in liquid form. The ampoule may be heated. The "A" precursor gas can be delivered at any suitable flow rate within a range from about 10 sccm to about 2,000 sccm, for example, from about 50 sccm to about 1,000 sccm, and in specific embodiments, from about 100 sccm to about 500 sccm, for example, about 200 sccm. The substrate 100 may be exposed to the metal-containing "A" precursor gas for a time period within a range from about 0.1 seconds to about 10 seconds, for example, from about 1 second to about 5 seconds, and in a specific example, for approximately 2 seconds.

Third Purge

After delivery of the second metal-containing precursor, another purge cycle can be initiated, similar to the first and second purge cycles.

Exposure to Radiation Such as E-beam, X-ray, Far UV or EUV Light

Figure 1B:
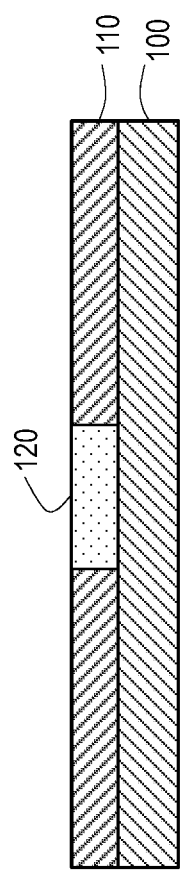
Figure 1C:
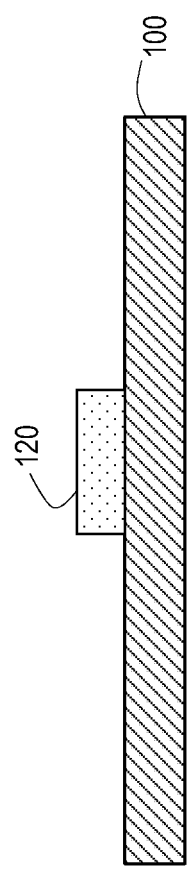

FIG. 1A shows substrate 100 with a deposited layer 110 on the substrate, formed by one or more ALD cycles. The deposited layer 110 comprises substituents present in the "A" precursor and the reactive, cross-linkable moieties present in the second metal precursor that remain partially unreacted in the deposited layer 110 which is soluble in developer solution. The deposited layer containing the cross-linkable moieties is then selectively exposed to radiation, such as far or extreme ultraviolet light, to create a pattern so that exposed portions of the deposited layer contain cross-linked moieties from the first and second silicon-containing precursors to form a silicon-containing film on the substrate that is less soluble in developer solution than unexposed portions. As shown in FIG. 1B, portions 120 of the deposited film have been exposed to radiation, such as far UV or extreme UV light, to form a metal oxide film. The remaining portions of the deposited layer 110 still contain reactive, cross-linkable moieties present in the first and second metal oxide precursors that remain partially unreacted in the deposited layer 110 and therefore soluble in a developer solution, such as a strong base. Thus, exposed portion 120 of the deposited layer contains cross-linked moieties from the first and second precursors and is therefore less soluble in developer solution than unexposed portions of the deposited layer 110. The substrate is then be exposed to a suitable developer solution to rinse away the unexposed portions of the deposited layer 120 to provide the patterned silicon dioxide precursor layer as shown in FIG. 10.

The ALD photoresist may be deposited with a thickness less than about 500 Angstroms, for example, between about 300 Angstroms and about 100 Angstroms, and in a specific example about 200 Angstroms. However, the final thickness of the material will ultimately depend on the desired application or use of the photoresist material.

The time interval for the pulse of the reactants can be varied depending upon a number of factors such as, for example, the volume capacity of the processing chamber employed, the vacuum system coupled thereto and the volatility/reactivity of the reactants used in the ALD process. For example, a large volume processing chamber require longer times to stabilize the process conditions and insure saturation of the substrate surfaces with each precursor, and a long time to effectively purge unreacted precursor before transitioning to the next precursor. Typically larger volume chambers can be employed which can accommodate a batch of substrates for simultaneous processing, for example in a coplanar arrangement with sufficient space in between to permit the introduction of precursors, carrier gases, and purge gases. Such chamber configurations can facilitate the of use of lower partial pressures of reactant precursors and lower reaction temperatures by simply increasing precursor exposure times (and total process times) while still delivering an equivalent or greater number of completed substrates per unit of time. A lower flow rate for the reactant gas may also lead to a longer time to stabilize the process conditions requiring a longer pulse time. A lower chamber pressure can result in the reactant gas being evacuated from the processing chamber more quickly requiring a longer pulse time. In general, the process conditions are advantageously selected so that a pulse of the precursor reactant gas has a sufficient amount of reactant so that at least a monolayer of the reactant is adsorbed on the substrate.

Formation of Photoresist on a Substrate with an Underlayer

As discussed above, a substrate can include an underlayer. Referring now to FIGS. 2A-2D, a substrate 200 having an underlayer 210 thereon is shown. In specific embodiments, the underlayer 210 can be an amorphous carbon underlayer. In other embodiments, the underlayer can be a spin-coated organic underlayer. Amorphous carbon underlayers and method for their formation are described in commonly assigned U.S. Pat. Nos. 6,573,030; 6,841,341; 7,223,526; and 7,335,462. The amorphous carbon layer has an etch selectivity in the range of 100:1 and 10:1 relative to silicon dioxide in oxygen based anisotropic plasma etch processes. The amorphous carbon underlayer 210 may be deposited by a variety of methods, such as chemical vapor deposition, plasma enhanced chemical vapor deposition, high density plasma chemical vapor deposition, or combinations thereof. The amorphous carbon underlayer 210 may include carbon and hydrogen or carbon, hydrogen, nitrogen, and oxygen, as well as other dopant atoms depending on the specific precursors employed in the deposition.

In one embodiment, the amorphous carbon underlayer 210 is formed from a gas mixture of a hydrocarbon compound and an inert gas such as argon, helium, xenon, krypton, neon, or combinations thereof. In specific embodiments, the carbon source is a gaseous hydrocarbon, and typically an unsaturated hydrocarbon, a material containing a double or triple bond between carbon atoms such that it is prone to polymerization. In one embodiment, the hydrocarbon compound has a general formula $C_xH_y$, where x has a range of between 2 and 4 and y has a range of between 2 and 10. For example, propylene ($C_3H_6$), propyne ($C_3H_4$), propane ($C_3H_8$), butane ($C_4H_{10}$), butylene ($C_4H_8$), butadiene ($C_4H_6$), or acetylene ($C_2H_2$) as well as combinations thereof, may be used as the hydrocarbon compound. Similarly, a variety of gases such as hydrogen, nitrogen, ammonia, or combinations thereof, among others, may be added to the gas mixture, if desired. Ar, He, and $N_2$ may be used to control the density and deposition rate of the amorphous carbon layer. The addition of hydrogen or ammonia can be used to control the hydrogen ratio of the amorphous carbon layer, as discussed below.

In general, the following deposition process parameters can be used to form the amorphous carbon layer. The process parameters range from a wafer temperature of about 100° C. to about 700° C., a chamber pressure of about 1 torr to about 20 torr, a hydrocarbon gas flow rate of about 50 sccm to about 500 sccm an RF power of between about 1 W/in$^2$ and about 100 W/in$^2$, such as between about 3 W/in$^2$ and about 20 W/in$^2$, and a plate spacing of between about 300 mils to about 600 mils. The amorphous carbon layer can be deposited to a thickness between about 200 Angstroms and about 10,000 Angstroms. The above process parameters provide a typical deposition rate for the amorphous carbon layer in the range of about 100 Angstroms/min to about 5,000 Angstroms/min and can be implemented on 200 mm or 300 mm substrates in a deposition chamber available from Applied Materials, Inc. of Santa Clara, Calif. An example of a deposition chamber that may be used is an APF® chamber on the Producer® system, available from Applied Materials, Inc.

Other deposition chambers can be used as well and the parameters listed above may vary according to the particular deposition chamber used to form the amorphous carbon layer. For example, other deposition chambers may have a larger or smaller volume, requiring gas flow rates that are larger or smaller than those recited for deposition chambers available from Applied Materials, Inc.

The as-deposited amorphous carbon underlayer 210 may have an adjustable carbon:hydrogen ratio that ranges from about 10% hydrogen to about 90% hydrogen. Controlling the hydrogen ratio of the amorphous carbon layer is desirable for tuning its optical properties as well as its etch selectivity. Specifically, as the hydrogen ratio decreases, the optical properties of the as-deposited layer such as for example, the absorption coefficient (k) increases. Similarly, as the hydrogen ratio decreases, the etch resistance of the amorphous carbon underlayer 210 may increase, depending on the etch chemistry used.

Figure 2A:
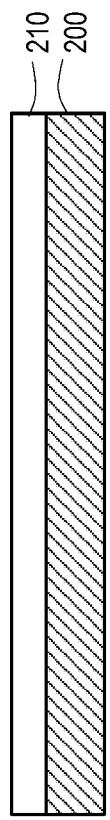
FIGS. 2A-2D show an embodiment of sequential process for depositing photoresist layer and forming a pattern on a substrate with an underlayer on the substrate.
Figure 2B:
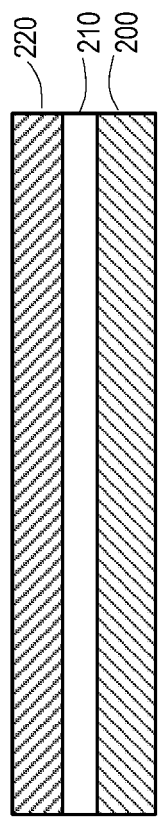
Figure 2C:
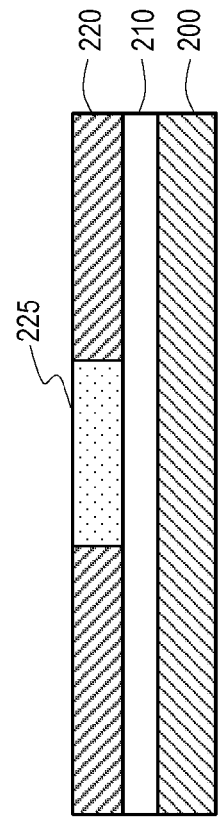
Figure 2D:
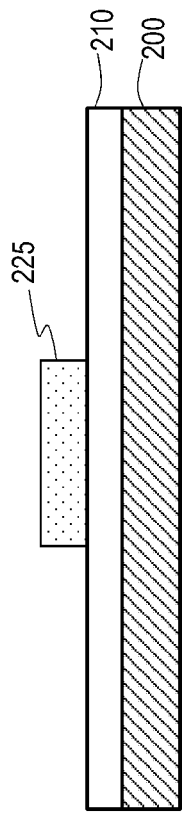

Thus, turning to FIG. 2B, a substrate 200 having an APF underlayer 210 can be utilized in an ALD process sequence for application of a thin radiation sensitive layer 220 of inorganic material which after patterning can serve as a mask for anisotropic plasma etching through for the APF underlayer 210 layer to the substrate 200. An ALD approach to the thin EUV sensitive organic layer could involve any of the ALD process sequences described above, such as an A, B, A, B sequence (with purges between each pulse) or an A, B, C, D sequence (with purges between each pulse. In a specific example, a sequence employing the cyclic deposition of a metal oxide based precursor (for example a volatile main group or transition metal alkoxide or halide) "A" precursor and a "B" co-reactant, for example, ozone, $H_2O$, $H_2O_2$, a mixture of $H_2O/H_2O_2$, or an EUV sensitive bridging ligand prone to decomposition or polymerization. In this specific case, the substrate temperature and chemistry can be selected specifically not to promote formation of an insoluble oxide precursor material, but to remain soluble unless exposed to far UV or EUV radiation, thereby providing an effective patterning method. Pattern development is accomplished using a developer solution, for example, a suitable dilute aqueous base similar to that used to develop current resist materials. Irreversible processes induced by selective far UV or EUV exposure (for example free radical and redox processes) promote the formation of an insoluble cross-linked material in exposed areas, which due to its metal oxide like composition provides an effective mask for the oxygen reactive ion etch transfer of the pattern through the underlying amorphous carbon based layer.

Other examples of an "A" precursor can be for example a volatile Hf or W alkoxide precursor coupled with a "B" reactant such as ozone, $H_2O$, $H_2O_2$, a mixture of $H_2O/H_2O_2$, or some other EUV sensitive bridging ligand. In the case of tungsten, far UV or EUV exposure followed by selective wet etch removal of unexposed areas as described above (for example using dilute aqueous base to remove unexposed tungsten oxides as tungstate $WO_4^{-2}$) can also be used to create an oxygen reactive ion resistant mask. In such a process sequence, the selection of ALD precursors which undergo effective surface saturation limited growth but only partial hydrolysis and condensation result in non-EUV exposed regions that remain soluble. This allows for the intentional design of materials that exhibit EUV induced reactions resulting in solubility changes necessary to permit pattern development.

More generally, an atomic layer deposition (ALD) process is used to form a layer 220 (shown in FIG. 2B) that can be patterned by exposure to far UV or EUV light. In exemplary embodiment of an ALD process, a first chemical precursor ("A") is pulsed, for example, delivering a metal species containing substituents to the substrate surface in a first half reaction. A first chemical precursor "A" is selected so its metal reacts with suitable underlying species (for example, O, H, or OH) until the surface is completely saturated. Excess unused reactants and the reaction by-products are removed, typically by an evacuation-pump down and/or by a flowing inert purge gas. Then a non-metal reactant B, for example, a gas or plasma containing an active oxygen or nitrogen species, is delivered to the surface, wherein the previously reacted terminating substituents or ligands of the first half reaction are reacted with new ligands from the "B" reactant, creating an exchange by-product. The reaction with "B" reactant is also self-limiting—the reaction proceeds only until the reactive sites on the metal precursor are consumed. A second purge period is typically utilized to remove unused reactants and the reaction by-products. Thereafter, a second precursor "A" containing reactive moieties cross-linkable with substituents present in the first "A" precursor is pulsed to the substrate surface, which react with ligands from the non-metal reactant. Typically, a third purge is then utilized to remove unused reactants and the reaction by-products The deposition cycle of pulses of the A metal oxide precursor, "B" non-metal reactant, and "A" precursor (typically including purges between each pulse) results in the substituents present in the A precursor and the reactive, cross-linkable moieties present in the A metal oxide precursor and second metal oxide precursor remain partially unreacted in the deposited layer which is soluble in developer solution. It will be understood that other ALD sequences described above such as pulses of "A" precursor, "B" reactant, "C" precursor, and "D" reactant (including purges between each pulse) can be utilized.

The deposited layer 220 containing partially unreacted, cross-linkable moieties is then selectively exposed to far or extreme ultraviolet light to create a pattern so that exposed portions 225 (shown in FIG. 2C) of the deposited layer contain cross-linked moieties from the first and second precursors to form a metal oxide film on the substrate that is less soluble to developer solution than unexposed portions of the deposited layer 220. The patterned substrate bearing both cross-linked layer portion 225 and soluble portions of the deposited layer 220 can then be exposed to a developer solution to remove the soluble portions of the deposited layer 220 resulting in the structure shown in FIG. 2D.

Referring now to FIGS. 3A-3D, another embodiment of a process sequence will now be described. Such a process can be used to provide a substrate which upon patterned exposure to radiation can become selectively activated to react with precursor chemicals. In such a way, ALD material could be grown selectively on patterned areas of the substrate. Such a substrate may be comprised of amorphous carbon based films terminated with radiation sensitive moieties, for example a composition capable of generating polar, reactive surface moieties (—OH, —NH, etc.) following EUV exposure. This may be accomplished by the introduction of stable, aprotic N and/or O containing precursors in the last few seconds of the process used for APF deposition.

Figure 3A:
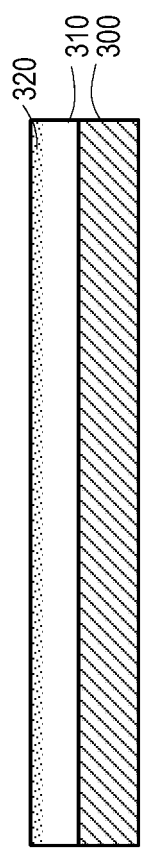
FIGS. 3A-3D show an embodiment of sequential process for depositing photoresist layer and forming a pattern on a substrate with an underlayer on the substrate.
Figure 3B:
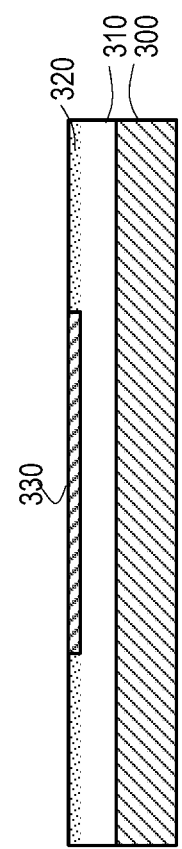

FIG. 3A shows a substrate 300 with an amorphous carbon layer 310, which can be formed using the processes described above. A thin surface layer 320 is formed on amorphous carbon layer 320 by radiation such as E-beam, x-ray, EUV, far UV exposure that results in a change in its reactivity with respect to binding an inorganic precursor. Radiation exposure of such an underlayer can change underlayer surface chemistry to allow the selective growth of an ALD dielectric film in either exposed or unexposed areas of the underlayer as described further herein. Alternatively, a thin surface 320 sensitive to E-beam, x-ray, EUV or far UV can be formed by forming a radiation sensitive self-assembled mono-layer deposited over the amorphous carbon layer 310 by either wet or dry vacuum processes.

The substrate 300 having the amorphous carbon layer 310 and the modified thin surface layer 320 is in a selective atomic layer deposition process for the selective initiation and ALD growth of an oxide etch mask. In embodiments in which radiation sensitive surface thin layer 330 is metal based (for example, derived from a Sn(IV) condensation catalyst precursor), it may be desirable to follow the radiation exposure with a wet rinse and dry step prior to performing a selective ALD sequence.

The effectiveness of this process will depend on the selectivity of the thin latent image generated at the surface 320 by radiation exposure (for example, E-beam, x-ray, EUV or far UV) for reaction with a volatile metal oxide precursor used in the ALD process to form modified region 330. Particularly useful precursors to introduce towards the end of the APF film deposition process include reactive monomers containing double or triple bonds together with main group heteroatoms (particularly O, N, and S) bonded only to carbon (or to each) but not to hydrogen. Non-limiting examples of volatile monomers that can be incorporated (via thermal or low power plasma polymerization) in/on the surface of APF type films include acrylonitrile, divinylether, and methylmethacrylate. The chemistry of the modified region 330 can include other groups to improve contrast and sensitivity, for example the inclusion of tertiary butyl groups which, if retained, may enhance contrast by helping to block the absorption of metal oxide ALD precursors while serving as a (hydrogen) reservoir for the generation of surface active O—H, N—H, or S—H bonds following extraction by radiation-excited intermediates. Selected additives might be added to the amorphous carbon precursors described above (for example propylene and acetylene based mixtures) either immediately before or after turning off plasma power.

Figure 3C:
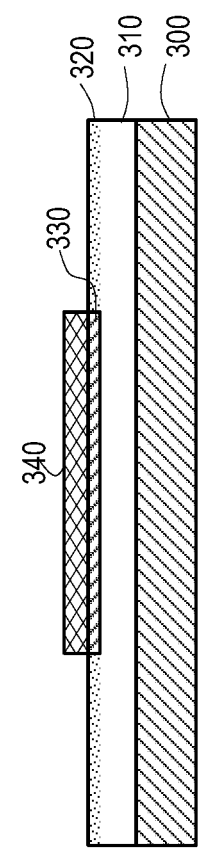

Referring now to FIG. 3C, a modified region 330 can be exposed to a volatile metal oxide precursor using a simpler ALD process than that described above. Thus, an ALD cycle of metal-containing "A" precursors and "B" reactants can be performed such that precursor "A" attaches only to either the exposed or unexposed regions of the surface modified APF film, and then precursor "B" reacts only with adsorbed and reacted precursor "A", and the process is continued to effect the selective ALD growth of an oxide mask precursor only in the radiation exposed regions (or with alternative photosensitizing layers, only in the unexposed areas).

Figure 3D:
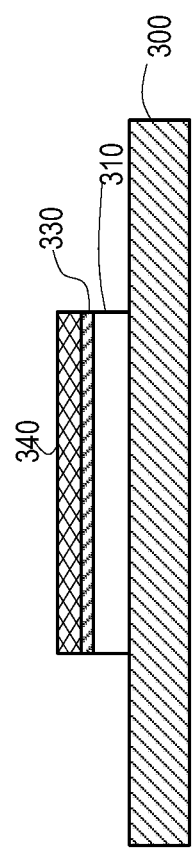

The regions of the amorphous carbon layer 310 that do not have the modified region 330 and deposited layer region 340 overlying the carbon layer 310 can be removed by a suitable etching process, for example, by oxygen anisotropic reactive ion etch, leaving the structure shown in FIG. 3D.

Thus by using the process sequence described above with respect to FIGS. 3A-3D, a selective ALD process is performed to form a selective metal oxide based etch mask only in the exposed regions of the amorphous carbon film. In one or more embodiments, the deposited underlayer 310 is in fact the imaged material, while the etch mask pattern is selectively generated in the ALD sequence. The specific composition and properties of the etch mask can be varied with precursor selection and can include a wide variety of materials in addition to silicon dioxide based compositions, for example the use of titanium, zirconium, or hafnium halides, alkoxides, or alkylamido complexes as metal precursors and water vapor as the reactant.

EXAMPLES

Example 1

PEALD Deposition of Trisilylamine and Acetylene

Photoresist may be deposited via plasma enhanced atomic layer deposition (PEALD). The precursor is trisilylamine, and is deposited onto the substrate. The substrate surface may then be exposed to acetylene as a second precursor. According to various embodiments, this may occur with or without a plasma. Deposition of trisilylamine and exposure to acetylene are carried out until the desired thickness of photoresist is achieved. Although not wishing to be bound by any particular theory, it is thought that sites of unsaturation in the acetylene provide sites that can be cross-linked with Si—H functionality in the trisilylamine on exposure to radiation, such as EUV, electron beam, etc.

According to one or more embodiments, many of the primary challenges with radiation such as EUV lithography can be addressed. While embodiments of the invention should not be bound by theory, it is understood that radiation such as EUV photons are absorbed in approximately only the top 200 Angstroms of resist materials, such that more conventional organic formulations typically much thicker than that exhibit resolution loss due to the generation and interactions of secondary electrons spreading deeper into the resist layer. According to one or more embodiments, patterning of the thin ALD resist layer can proceed throughout its thickness and its high oxide hard mask like etch resistance permit patterns to be transferred into underlying films.

Reference throughout this specification to "one embodiment," "certain embodiments," "one or more embodiments" or "an embodiment" means that a particular feature, structure, material, or characteristic described in connection with the embodiment is included in at least one embodiment of the invention. Thus, the appearances of the phrases such as "in one or more embodiments," "in certain embodiments," "in one embodiment" or "in an embodiment" in various places throughout this specification are not necessarily referring to the same embodiment of the invention. Furthermore, the particular features, structures, materials, or characteristics may be combined in any suitable manner in one or more embodiments. The order of description of the above method should not be considered limiting, and methods may use the described operations out of order or with omissions or additions.

It is to be understood that the above description is intended to be illustrative, and not restrictive. Many other embodiments will be apparent to those of ordinary skill in the art upon reviewing the above description. The scope of the invention should, therefore, be determined with reference to the appended claims, along with the full scope of equivalents to which such claims are entitled.

The invention claimed is:

1. A method for forming a radiation sensitive photoresist on a substrate comprising:
    exposing a substrate sequentially to alternating pulses of a first precursor containing substituents with cross-linkable moieties and a reactant selected from ozone, $H_2O$, $H_2O_2$, $NH_3$, reactive oxygen, reactive nitrogen, and reactive hydrogen and a second precursor containing reactive, moieties cross-linkable with the substituents in the first precursor to form a deposited layer such that reactive, cross-linkable moieties present in the first precursor and second precursor in the deposited layer remain partially unreacted and soluble to developer solution; and
    selectively exposing portions of the deposited layer to radiation selected from EUV, far UV, X-ray and e-beam to create a pattern in which exposed portions of the deposited layer contain cross-linked moieties that form a film on the substrate that is less soluble than unexposed portions of the deposited layer.

2. The method of claim 1, further comprising contacting the unexposed portions of the deposited layer with developer solution and removing the unexposed portions from the substrate.

3. The method of claim 1, wherein the deposited layer is formed by atomic layer deposition including:
    (a) exposing the substrate to a pulse of the first precursor containing substituents with cross-linkable moieties deposited on the substrate;
    (b) exposing the substrate to a first reactant pulse selected from ozone, $H_2O$, $H_2O_2$, $NH_3$, reactive oxygen, reactive nitrogen, and reactive hydrogen to surface react with the first precursor;
    (c) exposing the substrate to a second precursor containing reactive, moieties cross-linkable with the substituents in the first precursor; and
    (d) exposing the substrate to a second reactant pulse selected from ozone, $H_2O$, $H_2O_2$, $NH_3$, reactive oxygen, reactive nitrogen, and reactive hydrogen to surface react with the first precursor.

4. The method of claim 3, wherein (a) through (d) comprise a single atomic layer deposition cycle and the cycle is repeated at least once.

5. The method of claim 3, wherein the first precursor and the second precursor are the same.

6. The method of claim 3, wherein the first precursor and the second precursor are different.

7. The method of claim 3, wherein the first precursor is trisilylamine, and the second precursor is acetylene.

8. The method of claim 3, wherein the reactant pulse is selected from one of reactive oxygen, hydrogen and nitrogen species, wherein the reactive species is generated in a remote plasma.

9. The method of claim 2, wherein the unexposed deposited layer portions are only partially hydrolyzed or remain incompletely condensed.

10. The method of claim 1, wherein the sequential alternating pulses are followed by a purge process.

11. The method of claim 1, wherein the precursors are selected from metal-containing precursors.

12. The method of claim 11, wherein the precursors are selected from volatile silicon containing precursors.

13. The method of claim 1, wherein prior to formation of the deposited layer, the substrate surface is coated by an amorphous carbon layer or polymer film insoluble in the developer solution.

14. The method of claim 13, wherein the polymer film is a carbon-containing photoresist.

15. The method of claim 1, wherein the cross-linkable moieties present in the first precursor include Si—H bonds, and in the second precursor include silanol, vinyl, allyl, or halomethyl groups.

16. A method for forming a patterned photoresist on a substrate comprising:
    exposing a substrate sequentially to alternating pulses of a Si—H containing precursor and a silicon-containing precursor containing cross-linkable moieties by atomic layer deposition to form a deposited layer on the substrate; and
    selectively exposing portions of the layer to radiation selected from EUV, far UV, X-ray and e-beam to form a pattern in which exposed portions of the deposited layer is more cross-linked than unexposed portions of the deposited layer on the substrate.

17. The method of claim 16, wherein the exposed portions of the deposited layer form a cross-linked silicon containing film on the substrate.

18. The method of claim 16, further comprising exposing the substrate to a first reactant pulse selected from ozone, $H_2O$, $H_2O_2$, $NH_3$, reactive oxygen, reactive nitrogen, and reactive hydrogen to surface react with the first precursor after exposing the substrate to the Si—H containing precursor and to the silicon-containing precursor containing cross-linkable moieties.

19. The method of claim 18 wherein selectively exposing portions of the layer provides unexposed portions of the deposited layer in a form more soluble in a developer solution than the exposed portions.

20. The method of claim 19, further comprising removing the soluble layer portions.

21. The method of claim 19, wherein the unexposed soluble layer portions are only partially hydrolyzed or are hydrolyzed but incompletely condensed.

22. The method of claim 18, wherein the sequential alternating pulses are followed by a purge process.

23. The method of claim 16, wherein the cross-linkable moieties include hydroxyl, vinyl, allyl, or halomethyl groups.

24. The method of claim 23, wherein the Si—H containing precursor is selected from the group trisilylamine, 1,3,5-trisilacyclohexane, bis(diethylamino)silane, bis(tertiarybutylamino)silane, dichlorosilane, dibromosilane, diiodosilane, and disilane.

25. The method of claim 16, wherein the deposition of the Si—H containing layer employs a remote plasma activation performed immediately prior, during, or after the introduction of the Si—H containing precursor.

26. The method of claim 16, wherein the second silicon-containing precursor providing a cross-linkable moiety is a silicon-containing precursor containing one or more of a vinyl substituent, an allyl substituent, a halomethyl substituent, alkoxides, carboxylates, and halides which hydrolyze on exposure to water to form silanol substituents, at least some of which remain non-condensed in the resulting film prior to radiation exposure.

27. The method of claim 18, wherein prior to forming the deposited layer, an underlayer is deposited on the substrate.

28. The method of claim 27, wherein the underlayer is a carbon-containing layer formed by chemical vapor deposition.

29. The method of claim 28, wherein the underlayer comprises amorphous carbon.

30. The method of claim 28, wherein the exposed portions of the deposited layer provides a mask for the underlayer.

31. The method of claim 30, further comprising performing an oxygen reactive ion process etch pattern transfer through the mask and the underlayer to form the pattern.

32. A method of forming a patterned photoresist on a substrate comprising:
   forming a carbon-containing film on the substrate;
   forming surface layer in the carbon-containing film that is sensitive to radiation;
   exposing a portion of the carbon-containing film to radiation selected from EUV, far UV, X-ray and e-beam to provide an exposed surface portion; and
   selectively depositing by atomic layer deposition a metal-containing film only on the exposed regions of the carbon-containing film.

33. The method of claim 32, further comprising performing an etch process to etch pattern transfer through a mask and the underlayer to form the pattern.

34. The method of claim 33, wherein the etch process comprises an oxygen reactive ion process.

* * * * *